United States Patent
Jiang

(10) Patent No.: US 10,068,949 B2
(45) Date of Patent: Sep. 4, 2018

(54) DISPLAY PANEL

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Yurui Jiang, Guangdong (CN)

(73) Assignees: SHENZHEN CHINA STAR OPTOELECTRONICS TECHNOLOGY CO., LTD., Shenzhen (CN); WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 17 days.

(21) Appl. No.: 14/897,658

(22) PCT Filed: Jul. 30, 2015

(86) PCT No.: PCT/CN2015/085560
§ 371 (c)(1),
(2) Date: Dec. 11, 2015

(87) PCT Pub. No.: WO2017/012133
PCT Pub. Date: Jan. 26, 2017

(65) Prior Publication Data
US 2018/0122869 A1    May 3, 2018

(30) Foreign Application Priority Data
Jul. 22, 2015 (CN) .......................... 2015 1 0432410

(51) Int. Cl.
*G02F 1/1335* (2006.01)
*H01L 27/32* (2006.01)
*H01L 51/52* (2006.01)
*G09G 3/36* (2006.01)
*H01L 51/50* (2006.01)

(52) U.S. Cl.
CPC .... *H01L 27/3211* (2013.01); *G02F 1/133528* (2013.01); *G02F 1/133553* (2013.01);
(Continued)

(58) Field of Classification Search
CPC ... G02B 26/02; G02B 5/201; G02F 1/133621; G02F 2001/133614
See application file for complete search history.

(56) References Cited

U.S. PATENT DOCUMENTS

2008/0145571 A1* 6/2008 Kobayashi .............. C07C 13/66 428/1.4
2013/0146903 A1* 6/2013 Ichikawa ................ H01L 33/50 257/88

(Continued)

FOREIGN PATENT DOCUMENTS

CN    103227189 A    7/2013
CN    103268736 A    8/2013

(Continued)

OTHER PUBLICATIONS

Office Action dated Jul. 28, 2017, by the State Intellectual Property Office of People's Republic of China in corresponding Chinese Patent Application No. 201510432410.8 (7 pages).

(Continued)

*Primary Examiner* — Abbas Abdulselam
(74) *Attorney, Agent, or Firm* — Buchanan Ingersoll & Rooney PC

(57) ABSTRACT

A display panel is disclosed. The display panel comprises an excitation light emitting unit, a wavelength conversion unit which contains quantum dots, and a glass substrate, wherein excitation light coming from the excitation light emitting unit enters into the wavelength conversion unit, a wavelength of the excitation light is converted into a needed wavelength for image display by the wavelength conversion (Continued)

unit, and then the excitation light exits from the glass substrate. The display panel according to the present disclosure has a larger color gamut.

9 Claims, 5 Drawing Sheets

(52) U.S. Cl.
CPC .. *G02F 1/133617* (2013.01); *G02F 1/133621* (2013.01); *G09G 3/3607* (2013.01); *H01L 27/32* (2013.01); *H01L 27/322* (2013.01); *H01L 27/3225* (2013.01); *H01L 51/502* (2013.01); *H01L 51/52* (2013.01)

(56) References Cited

U.S. PATENT DOCUMENTS

| | | |
|---|---|---|
| 2015/0076469 A1 | 3/2015 | Ikemizu et al. |
| 2015/0145405 A1 | 5/2015 | Yang et al. |
| 2016/0209706 A1* | 7/2016 | Miki ................. G02F 1/133617 |
| 2016/0370656 A1 | 12/2016 | Zhang et al. |
| 2016/0372528 A1* | 12/2016 | Kamura ............. H01L 51/0096 |

FOREIGN PATENT DOCUMENTS

| | | |
|---|---|---|
| CN | 203179892 U | 9/2013 |
| CN | 104143564 A | 11/2014 |
| CN | 104360540 A | 2/2015 |
| CN | 104516149 A | 4/2015 |
| WO | 2013/157494 A1 | 10/2013 |

OTHER PUBLICATIONS

Notification of Transmittal of the International Search Report and the Written Opinion of the International Searching Authority (Forms PCT/ISA/210, PCT/ISA/220, and PCT/ISA/237) dated Apr. 18, 2016, by the State Intellectual Property Office of People's Republic of China Patent Office in corresponding International Application No. PCT/CN2015/085560. (11 pages).

* cited by examiner ial, a blue organic light-emitting material, and a green organic light-emitting material should be vapor-plated on a large sized glass substrate in sequence. As a result, the qualified rate of the display panel is low, and the cost of the OLED display panel is relatively high.

DISPLAY PANEL

Cross Reference to Related Application

The present application claims priority of Chinese patent application CN201510432410.8, entitled "Display Panel" and filed on Jul. 22, 2015, the entirety of which is incorporated herein by reference.

FIELD OF THE INVENTION

The present disclosure relates to the technical field of display, and particularly to a display panel.

BACKGROUND OF THE INVENTION

FIG. 1 schematically shows a Thin Film Transistor Liquid Crystal Display (TFT-LCD) in the prior art. As shown in FIG. 1, the TFT-LCD in the prior art comprises a light bar 1, a light guide plate 2, a brightness-enhancing film 3, a lower polarizer 4, an array substrate 5, a liquid crystal layer 6, a color filter substrate 7, an upper polarizer 8, and a reflective sheet 9. Liquid crystal molecules can be rotated through controlling a voltage that is applied to the liquid crystal layer 6, so that a polarization direction of a linearly polarized light that is emitted by a backlight module (the backlight module comprises the light bar 1, the light guide plate 2, the brightness-enhancing film 3, and the reflective sheet 9) can be changed after passing through the lower polarizer 4. Light with different colors can be formed after passing through the color filter substrate 7. Since the polarization direction of the light can form different angles with a light transmission axis of the upper polarizer 8, the strength of the light can be controlled, and a needed image can be displayed.

In the TFT-LCD in the prior art, the liquid crystal layer 6 cannot emit light itself, and thus the aforesaid backlight module is used to serve as a light source thereof. As a result, a color gamut of the LCD is relatively small.

FIG. 2 schematically shows an Organic Light Emitting Diode (OLED) display panel in the prior art. As shown in FIG. 2, the OLED display panel in the prior art comprises a glass substrate 10, an anode 11 (the anode 11 is mainly made of Indium Tin Oxide, i.e., ITO), an electron-hole injection layer 12, an electron-hole transmission layer 13, an organic blue light emitting layer 14, an organic red light emitting layer 15, an organic green light emitting layer 16, an electron transmission layer 17, an electron injection layer 18, and a cathode 19. As shown in FIG. 2, arrows refer to light exiting direction.

During the manufacturing procedure of the OLED display panel with this structure, a red organic light-emitting material, a blue organic light-emitting material, and a green organic light-emitting material should be vapor-plated on a large sized glass substrate in sequence. As a result, the qualified rate of the display panel is low, and the cost of the OLED display panel is relatively high.

SUMMARY OF THE INVENTION

In order to solve the technical problem in the prior art, the present disclosure provides a display panel, which comprises:
an excitation light emitting unit;
a wavelength conversion unit which contains quantum dots; and
a glass substrate,
wherein excitation light coming from the excitation light emitting unit enters into the wavelength conversion unit, a wavelength of the excitation light is converted into a needed wavelength for image display by the wavelength conversion unit, and then the excitation light exits from the glass substrate. It can be seen by the following experimental results that, the display panel according to the present disclosure has a larger color gamut.

Preferably, the excitation light emitting unit and the wavelength conversion unit both have a layered structure and are arranged at a same side of the glass substrate.

Preferably, the wavelength conversion unit comprises a quantum dot diaphragm that is affixed on the glass substrate. Since the light that is emitted by the quantum dot after excitation has a relatively narrow half peak width, the display panel according to the present disclosure has a larger color gamut than the liquid crystal display panel in the prior art.

Preferably, the quantum dot diaphragm comprises a red quantum dot diaphragm which can emit red light, a green quantum dot diaphragm which can emit green light, and a blue quantum dot diaphragm which can emit blue light. According to the present disclosure, the display panel can emit light itself, and thus a backlight module is not needed. The thickness of the display panel disclosed herein can be greatly reduced compared with the liquid crystal display panel in the prior art. The display panel disclosed herein has a low brightness when it is in a dark state, and has a high picture contrast.

Preferably, a diameter of a quantum dot in the quantum dot diaphragm ranges from 2 nm to 20 nm.

Preferably, the quantum dot diaphragm is divided into a plurality of pixels, and at least one pixel comprises three sub pixels corresponding to the red quantum dot diaphragm, the green quantum dot diaphragm, and the blue quantum dot diaphragm respectively. In one pixel, red light, green light, and blue light with different strength can be mixed, so that an image of the pixel can be formed.

Preferably, the quantum dot comprises a core part arranged at a center thereof, a shell part arranged outside the core part, and an organic ligand arranged outside the shell part. With the core-shell structure, the light-emitting efficiency of the quantum dot can be improved. The quantum dots can be mounted to a carrier substance through the organic ligand.

Preferably, the excitation light is ultraviolet having a wavelength in a range from 100 nm to 400 nm.

Preferably, the excitation light emitting unit comprises an anode electrode layer, an electron-hole injection layer, an electron-hole transmission layer, an organic ultraviolet-emitting layer, an electron transmission layer, an electron injection layer, and a cathode electrode layer that are arranged in sequence adjacent to the quantum dot diaphragm. A voltage can be applied between the anode electrode layer and the cathode electrode layer. With respect to the OLED display panel in the prior art, three organic light-emitting layers should be vapor-plated on the entire surface of the glass substrate. While in the display panel according to one embodiment of the present disclosure, only an organic ultraviolet-emitting layer needs to be vapor-plated on the entire surface of the glass substrate. Therefore, the manufacturing difficulty of the display panel can be greatly reduced, the qualified rate of the panel can be improved, and the cost thereof can be reduced.

Preferably, the glass substrate is provided with an ultraviolet absorption film at one surface thereof far from the excitation light emitting unit. In this manner, the residual ultraviolet can be absorbed, and thus the harm to audience can be avoided.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings.

Figure 1:
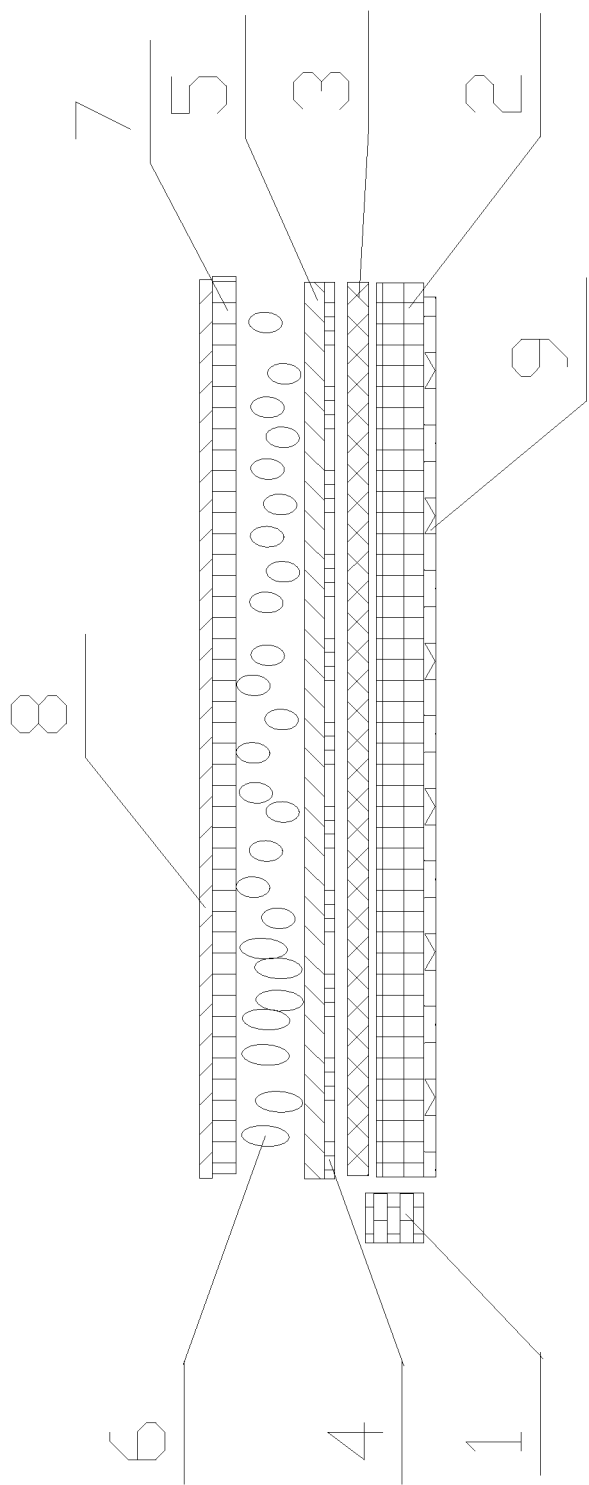
FIG. 1 schematically shows a structure of a TFT-LCD in the prior art.
Figure 2:
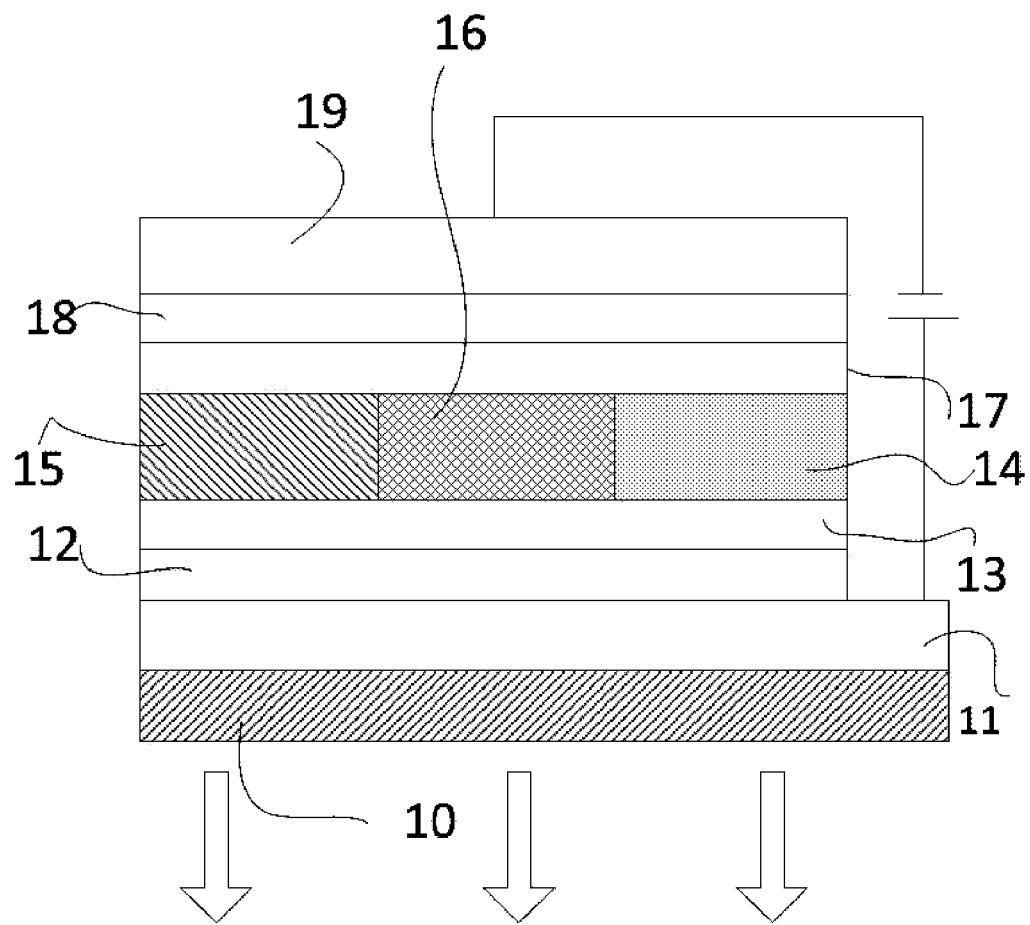
FIG. 2 schematically shows a structure of an OLED display panel in the prior art.

In the drawings, the same components are represented by the same reference signs, and the size of each component does not represent the actual size of the corresponding component.

DETAILED DESCRIPTION OF THE EMBODIMENTS

The present disclosure will be illustrated further with reference to the drawings.

Figure 3:
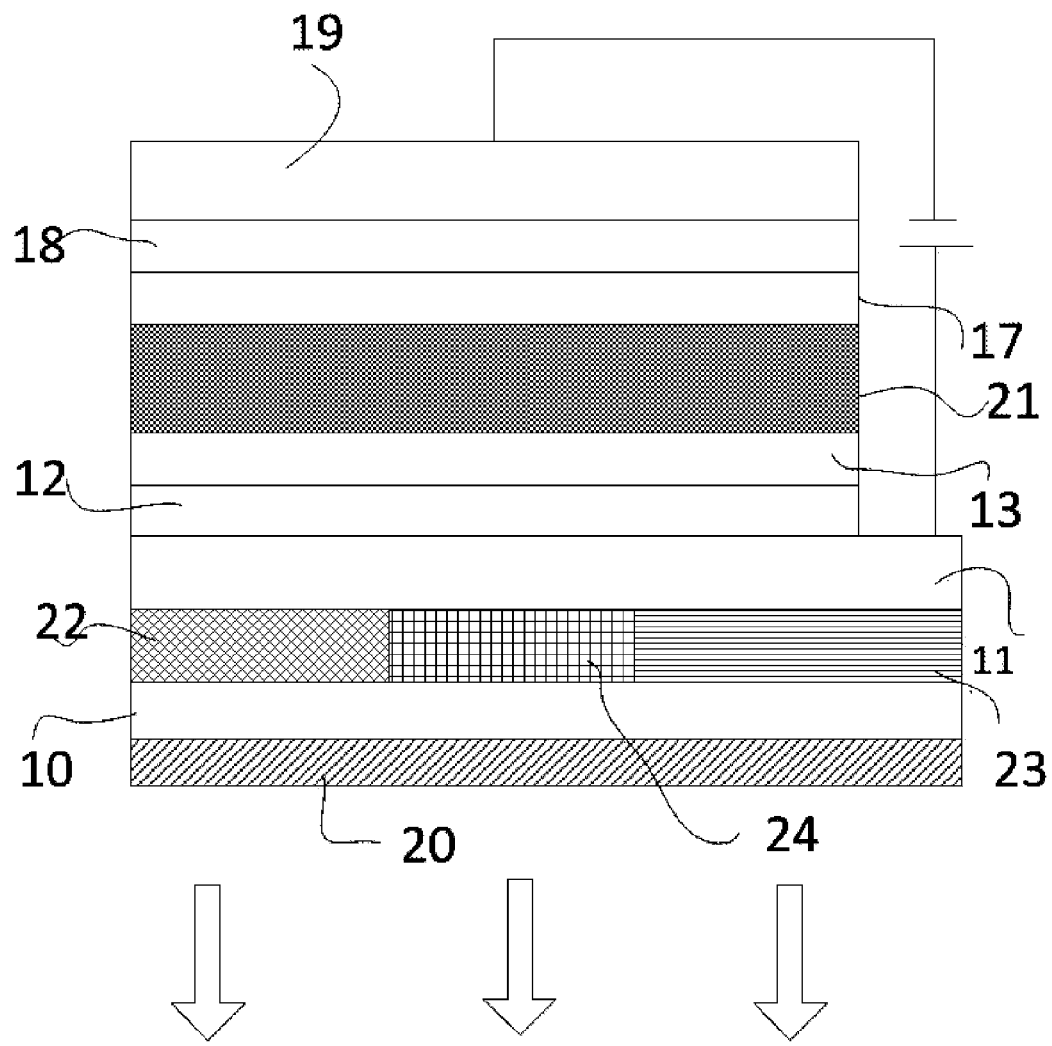
FIG. 3 schematically shows a structure of a display panel according to one embodiment of the present disclosure.

FIG. 3 schematically shows a structure of a display panel according to one embodiment of the present disclosure. As shown in FIG. 3, the display panel comprises an excitation light emitting unit, a wavelength conversion unit which contains quantum dots, and a glass substrate 10. Excitation light coming from the excitation light emitting unit enters into the wavelength conversion unit, a wavelength of the excitation light is converted into a needed wavelength for image display by the wavelength conversion unit, and then the excitation light exits from the glass substrate 10. Arrows refer to light exiting direction. The excitation light emitting unit and the wavelength conversion unit both have a layered structure and are arranged at a same side of the glass substrate 10 (as shown in FIG. 3, the excitation light emitting unit and the wavelength conversion unit are arranged at an upper side of the glass substrate 10). The glass substrate 10 is provided with an ultraviolet absorption film 20 at one surface thereof far from the excitation light emitting unit (as shown in FIG. 3, the ultraviolet absorption film 20 is arranged at a lower surface of the glass substrate 10).

The wavelength conversion unit comprises a quantum dot diaphragm that is affixed on the glass substrate 10. Specifically, the quantum dot diaphragm comprises a red quantum dot diaphragm 22 which can emit red light, a blue quantum dot diaphragm 23 which can emit blue light, and a green quantum dot diaphragm 24 which can emit green light. According to one embodiment, a diameter of a quantum dot in the quantum dot diaphragm (i.e., the red quantum dot diaphragm 22, the blue quantum dot diaphragm 23, and the green quantum dot diaphragm 24) ranges from 2 nm to 20 nm.

Specifically, the quantum dot diaphragm is divided into a plurality of pixels, and each pixel comprises three sub pixels corresponding to the red quantum dot diaphragm 22, the blue quantum dot diaphragm 23, and the green quantum dot diaphragm 24 respectively.

The quantum dot (QD) is a semi-conductive structure with a nanometer size. Different from one-dimensional quantum wire, the quantum dot has a zero-dimensional structure. The diameter of the quantum dot ranges from 2 nm to 20 nm, and wave with short wavelength can be converted into visible light with different colors (wavelength) containing three primary colors, i.e., red light, green light, and blue light.

Figure 4:
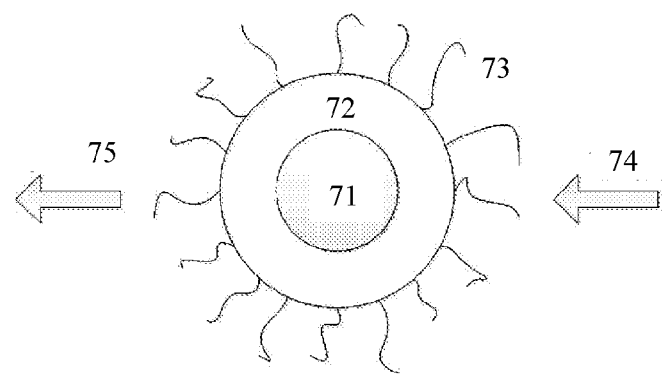
FIG. 4 schematically shows a structure of a quantum dot in the display panel according to one embodiment of the present disclosure.

FIG. 4 schematically shows a structure of the quantum dot in the display panel according to one embodiment of the present disclosure. It can be seen clearly from FIG. 4 that, the quantum dot comprises a core part 71 arranged at a center thereof, a shell part 72 arranged outside the core part 71, and an organic ligand 73 arranged outside the shell part 72. The core part 71 can be made of one semi-conductive material or a plurality of semi-conductive materials selected from a group consisting of ZnS, ZnO, GaN, and ZnSe. The shell part 72 can be made of one oxide selected from a group consisting of SiO, TiO, ZnO, and $SiO_2$. The organic ligand 73 can be a group containing COOH and $NH_4$. With the arrangement of the core-shell structure and the organic ligand, the light-emitting effect of the quantum dot can be enhanced. In the display panel according to one embodiment of the present disclosure, ultraviolet 74 irradiates the quantum dot and excites it. The quantum dot, after absorbing the energy of the ultraviolet 74, would transit from a relatively stable energy level to a relatively unstable energy level, and then transit from a relatively unstable energy level to a relatively stable energy level (for example, from an excited state to a ground state). During the transition procedure from a relatively unstable energy level to a relatively stable energy level, the quantum dot can release energy in a form of visible light. A suitable material and structure can be selected, so that the quantum dot can emit red light, green light, or blue light.

In the display panel according to one embodiment of the present disclosure, the excitation light is ultraviolet having a wavelength in a range from 100 nm to 400 nm.

As shown in FIG. 3 again, the excitation light emitting unit comprises an anode electrode layer 11, an electron-hole injection layer 12, an electron-hole transmission layer 13, an organic ultraviolet-emitting layer 21, an electron transmission layer 17, an electron injection layer 18, and a cathode electrode layer 19 that are arranged in sequence adjacent to the quantum dot diaphragm (i.e., the red quantum dot diaphragm 22, the blue quantum dot diaphragm 23, and the green quantum dot diaphragm 24). In addition, the glass substrate 10 is provided with an ultraviolet absorption film 20 at one surface thereof far from the excitation light emitting unit. The ultraviolet absorption film 20 can absorb residual ultraviolet.

Figure 5:
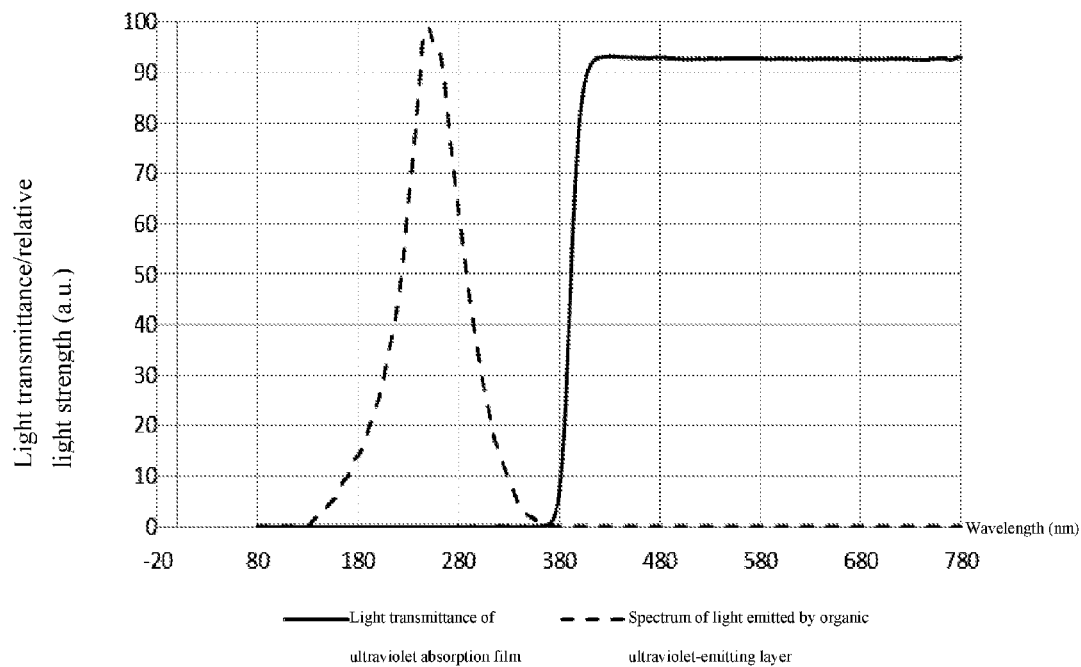
FIG. 5 schematically shows a light transmittance of an ultraviolet absorption film and a spectrum of light emitted by an organic ultraviolet-emitting layer of the display panel according to one embodiment of the present disclosure.

FIG. 5 schematically shows a light transmittance of an ultraviolet absorption film 20 and a spectrum of light emitted by an organic ultraviolet-emitting layer 21 of the display panel according to one embodiment of the present disclosure. As shown in FIG. 5, solid line represents the light transmittance of the ultraviolet absorption film 20, and dotted line represents the spectrum of light emitted by the organic ultraviolet-emitting layer 21. Horizontal coordinate represents wavelength, and vertical coordinate represents light transmittance or relative light strength. Of course, FIG. 5 only shows a specific embodiment of the ultraviolet absorption film 20 and the organic ultraviolet-emitting layer 21, and the film or layer which has light transmitting or emitting characteristics different from those shown in FIG. 5 can also be used herein.

As shown in FIG. 3 again, in the display panel according to one embodiment of the present disclosure, a voltage can be applied between the cathode electrode layer 19 and the anode electrode layer 11. Under driving of the voltage, electrons from the electron injection layer 18 enter into the organic ultraviolet-emitting layer 21 through the electron transmission layer 17, and electron-holes from the electron-hole injection layer 12 enter into the organic ultraviolet-emitting layer 21 through the electron-hole transmission layer 13. The electrons and the electron-holes recombine in the organic ultraviolet-emitting layer 21, and ultraviolet can be emitted (a wavelength of the ultraviolet is in a range from 100 nm to 400 nm). The ultraviolet irradiates the quantum dot diaphragm (i.e., the red quantum dot diaphragm 22, the blue quantum dot diaphragm 23, and the green quantum dot diaphragm 24), and the quantum dots in the quantum dot diaphragm can emit light with different colors under the excitation of the ultraviolet. A strength of the ultraviolet emitted by the organic ultraviolet-emitting layer 21 can be controlled through regulating the voltage between the cathode electrode layer 19 and the anode electrode layer 11. The ultraviolet irradiates the quantum dot diaphragm, and the quantum dots in the quantum dot diaphragm can emit visible light (a wavelength of the visible light depends on a size of the quantum dot in the quantum dot diaphragm) under the excitation of the ultraviolet. In one pixel, red light, green light, and blue light with different strength can be mixed, so that an image of the pixel can be formed. Residual ultraviolet enters into the ultraviolet absorption film 20 after passing through the glass substrate 10 and can be absorbed by the ultraviolet absorption film 20, so that the harm to audience can be avoided. The three primary colors coming from the quantum dot diaphragm mix with one another in each pixel, so that a needed color of the image of the display panel can be formed.

Compared with the liquid crystal display panel in the prior art, the display panel according to one embodiment of the present disclosure has the advantages of self light-emitting, a high picture contrast, a small thickness, and a large color gamut.

Figure 6:
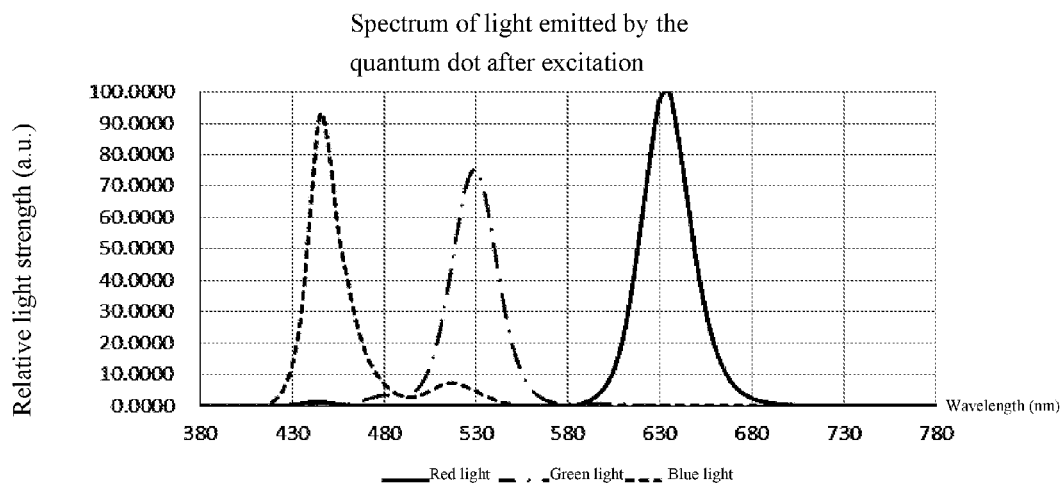
FIG. 6 schematically shows a spectrum of light emitted by the quantum dot after excitation in the display panel according to one embodiment of the present disclosure.

FIG. 6 schematically shows a spectrum of light emitted by the quantum dot after excitation in the display panel according to one embodiment of the present disclosure, wherein the horizontal coordinate represents wavelength, and the vertical coordinate represents relative light strength. As shown in FIG. 6, solid line represents red light, dash dot line represents green light, and dotted line represents blue light.

It can be clearly seen from FIG. 6 that, the light that is emitted by the quantum dot after excitation has a relatively narrow half peak width, and thus the display panel according to the present disclosure has a larger color gamut than the liquid crystal display panel in the prior art.

It is shown after test that, the display panel according to the present disclosure can reach 110% of the National Television System Committee (NTSC) standard, while the liquid crystal display panel in the prior art can only reach 70% of the NTSC standard. According to one embodiment of the present disclosure, the display panel can emit light itself, and thus a backlight module is not needed. The thickness of the display panel can be greatly reduced compared with the liquid crystal display panel in the prior art. The display panel disclosed herein has a low brightness when it is in a dark state, and has a high picture contrast.

Figure 7:
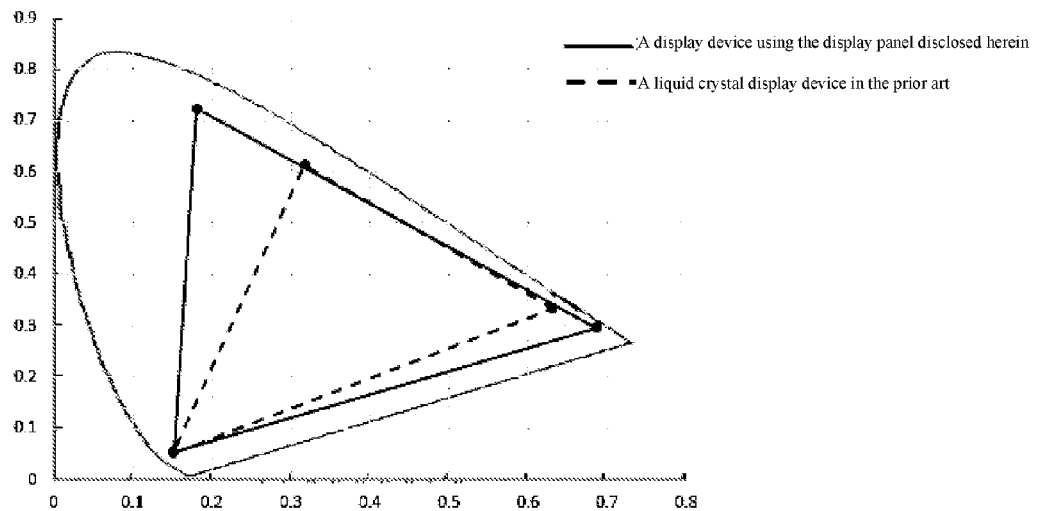
FIG. 7 is a comparative diagram of a color gamut of a display device using the display panel according to one embodiment of the present disclosure and a color gamut of a liquid crystal display device in the prior art.

FIG. 7 is a comparative diagram of a color gamut of a display device using the display panel according to one embodiment of the present disclosure and a color gamut of a liquid crystal display device in the prior art. FIG. 7 is a CIE chromaticity diagram. It can be seen clearly from FIG. 7 that, the display device using the display panel according to one embodiment of the present disclosure has a much larger color gamut than the liquid crystal display device in the prior art (i.e., an area of solid line triangle is much larger than an area of dotted line triangle). It is shown that, the display panel according to one embodiment of the present disclosure has a larger color gamut.

Compared with the OLED display panel in the prior art, the display panel according to one embodiment of the present disclosure has a low manufacturing difficulty, a low cost, and a high qualified rate. With respect to the OLED display panel in the prior art, three organic light-emitting layers should be vapor-plated on the glass substrate. While in the display panel according to one embodiment of the present disclosure, only one organic ultraviolet-emitting layer needs to be vapor-plated on the glass substrate. Therefore, the manufacturing difficulty of the display panel can be greatly reduced, the qualified rate of the panel can be improved, and the cost thereof can be reduced.

The present disclosure is illustrated hereinabove with reference to the specific embodiments, which are only examples of the principle and use of the present disclosure. Those skilled in the art can make amendments to the embodiments disclosed herein or provide other arrangements without departing from the spirit and scope of the present disclosure. The technical feature described in one embodiment can also be used in other embodiments.

The invention claimed is:
1. A display panel, comprising:
an excitation light emitting unit;
a wavelength conversion unit which contains quantum dots; and
only one glass substrate,
wherein excitation light coming from the excitation light emitting unit enters into the wavelength conversion unit, a wavelength of the excitation light is converted into a needed wavelength for image display by the wavelength conversion unit, and then the excitation light exits from the glass substrate;
wherein both the excitation light emitting unit and the wavelength conversion unit are arranged at a same side of the glass substrate;
wherein the wavelength conversion unit is provided directly on the glass substrate and the excitation light emitting unit is provided directly on the wavelength conversion unit;
wherein the glass substrate is provided with an ultraviolet absorption film at one surface thereof far from the excitation light emitting unit.
2. The display panel according to claim 1, wherein the excitation light emitting unit and the wavelength conversion unit both have a layered structure.

3. The display panel according to claim 2, wherein the wavelength conversion unit comprises a quantum dot diaphragm that is affixed on the glass substrate.

4. The display panel according to claim 3, wherein the quantum dot diaphragm comprises a red quantum dot diaphragm which can emit red light, a green quantum dot diaphragm which can emit green light, and a blue quantum dot diaphragm which can emit blue light.

5. The display panel according to claim 4, wherein a diameter of a quantum dot in the quantum dot diaphragm ranges from 2 nm to 20 nm.

6. The display panel according to claim 4, wherein the quantum dot diaphragm is divided into a plurality of pixels, and at least one pixel comprises three sub pixels corresponding to the red quantum dot diaphragm, the green quantum dot diaphragm, and the blue quantum dot diaphragm respectively.

7. The display panel according to claim 4, wherein the quantum dot comprises a core part arranged at a center thereof, a shell part arranged outside the core part, and an organic ligand arranged outside the shell part.

8. The display panel according to claim 1, wherein the excitation light is ultraviolet having a wavelength in a range from 100 nm to 400 nm.

9. The display panel according to claim 8,
wherein the excitation light emitting unit comprises an anode electrode layer, an electron-hole injection layer, an electron-hole transmission layer, an organic ultraviolet-emitting layer, an electron transmission layer, an electron injection layer, and a cathode electrode layer that are arranged in sequence adjacent to the quantum dot diaphragm; and
wherein a voltage can be applied between the anode electrode layer and the cathode electrode layer.

* * * * *